United States Patent
Ho et al.

(10) Patent No.: US 9,373,597 B2
(45) Date of Patent: Jun. 21, 2016

(54) CHIP PACKAGE AND METHOD THEREOF

(71) Applicant: XINTEC INC., Taoyuan (TW)

(72) Inventors: Yen-Shih Ho, Kaohsiung (TW);
Chia-Ming Cheng, New Taipei (TW);
Shu-Ming Chang, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/662,151

(22) Filed: Mar. 18, 2015

(65) Prior Publication Data
US 2015/0270236 A1    Sep. 24, 2015

Related U.S. Application Data

(60) Provisional application No. 61/955,697, filed on Mar. 19, 2014.

(51) Int. Cl.
*H01L 23/00* (2006.01)
*H01L 29/06* (2006.01)
*H01L 23/525* (2006.01)

(52) U.S. Cl.
CPC ............ *H01L 24/14* (2013.01); *H01L 24/03* (2013.01); *H01L 24/05* (2013.01); *H01L 24/06* (2013.01); *H01L 29/0657* (2013.01); *H01L 23/525* (2013.01); *H01L 24/13* (2013.01); *H01L 2224/0235* (2013.01); *H01L 2224/0236* (2013.01); *H01L 2224/0237* (2013.01); *H01L 2224/0239* (2013.01); *H01L 2224/02233* (2013.01); *H01L 2224/02313* (2013.01); *H01L 2224/02371* (2013.01); *H01L 2224/02375* (2013.01); *H01L 2224/0401* (2013.01); *H01L 2224/05647* (2013.01); *H01L 2224/05655* (2013.01); *H01L 2224/13111* (2013.01); *H01L 2224/14155* (2013.01); *H01L 2224/14165* (2013.01); *H01L 2924/014* (2013.01)

(58) Field of Classification Search
CPC ......... H01L 24/14; H01L 24/17; H01L 24/67; H01L 24/70; H01L 2224/035; H01L 2224/0237; H01L 2224/02373; H01L 2224/48227; H01L 2224/97; H01L 2924/15311; H01L 2224/85; H01L 24/16; H01L 2924/00
See application file for complete search history.

(56) References Cited

U.S. PATENT DOCUMENTS

| | | | | |
|---|---|---|---|---|
| 2002/0008325 A1* | 1/2002 | Tominaga | | H01L 23/13 257/778 |
| 2008/0284003 A1* | 11/2008 | Kwang | | H01L 24/32 257/724 |
| 2012/0146177 A1* | 6/2012 | Choi | | H01L 25/16 257/528 |

* cited by examiner

*Primary Examiner* — Jasmine Clark
(74) *Attorney, Agent, or Firm* — Liu & Liu

(57) ABSTRACT

The present invention provides a chip package that includes a semiconductor chip, at least one recess, a plurality of first redistribution metal lines, and at least one protrusion. The semiconductor chip has a plurality of conductive pads disposed on an upper surface of the semiconductor chip. The recess extends from the upper surface to a lower surface of the semiconductor chip, and is arranged on the side of the semiconductor chip. The first redistribution metal lines are disposed on the upper surface, electrically connected to the conductive pad individually, and extended into the recesses separately. The protrusion is disposed in the recess and located between the adjacent first redistribution metal lines.

11 Claims, 3 Drawing Sheets

CHIP PACKAGE AND METHOD THEREOF

RELATED APPLICATIONS

This application claims priority to U.S. provisional Application Ser. No. 61/955,697, filed Mar. 19, 2014, which is herein incorporated by reference.

BACKGROUND

1. Field of Invention

The present invention relates to a package and a fabricating method thereof, and more particularly, to a chip package and a fabricating method thereof.

2. Description of Related Art

With the needs of electronic devices in multifunction and compact appearance, semiconductor chips adapted to the electronic devices is not only getting miniaturized, but also face higher and higher challenges, due to the increase in wiring density, of fabricating a semiconductor chip package in subsequent processes. Wafer-level chip package (WLCP) is one of the methods of packaging the semiconductor chip, which the WLCP refers to that all the manufactured chips are packaged and tested, and then the wafer is cut into a single chip package. The miniaturization and the increased wiring density of the semiconductor chip also complicate the structural design and fabrication of the chip package. Therefore, for the manufacture of the chip package the, not only the fabricating cost increases because of the higher requirements of the manufacturing process, but also the risk at the decrease of yield rate. Accordingly, it is important in chip package technology to develop a more reliable chip package and fabricating method that is more suitable for mass production.

SUMMARY

The present invention is providing a chip package and a fabricating method thereof. A recess of the chip package has protrusions located between adjacent redistribution metal lines, which need independent signal. Therefore, the protrusions can make sure that the adjacent redistribution metal lines are isolated, and do not electrically connect with each other resulting in short circuit. Accordingly, based on above statement, not only the process margin in the photolithography can be increased during the fabrication of redistribution metal lines, the yield rate of chip package can also be raised, in order to reduce the fabrication cost efficiently. Besides, the protrusions substantially are completely fabricated with the recess, and do not need additional photo mask and photolithography process thereof. Therefore, the present invention has the less complicated process and the efficacy of efficiently decreasing fabricating cost.

The disclosure of the present invention provides a chip package. The chip package includes a semiconductor chip, at least one recess, a plurality of first redistribution metal lines, and at least one protrusion. The semiconductor chip has a plurality of conductive pads disposed on an upper surface of the semiconductor chip. The recess is extended from the upper surface to a lower surface of the semiconductor chip, and arranged on a side of semiconductor chip. The first redistribution metal lines are disposed on the upper surface, electrically connected to the conductive pads individually, and extended into the recess separately. The protrusion is disposed in the recess and located between the adjacent first redistribution metal lines.

In one embodiment of the present invention, the chip package further includes a plurality of second redistribution metal lines disposed on the upper surface, the semiconductor chip has a plurality of ground pads disposed on the upper surface, and the second redistribution metal lines are electrically connected to the ground pads individually, and extended into the recess separately.

In one embodiment of the present invention, the second redistribution metal lines are electrically connected to each other in the recess.

In one embodiment of the present invention, the chip package further includes a plurality of third redistribution metal lines disposed on the upper surface, the third redistribution metal lines are extended into the recess separately, and electrically connected to each other in the recess.

In one embodiment of the present invention, the chip package further includes a conductive structure disposed in the recess, and located on the first redistribution metal lines individually.

In one embodiment of the present invention, the conductive structure includes a plurality of solder balls.

In one embodiment of the present invention, the solder balls include tin.

In one embodiment of the present invention, the protrusion includes silicon, germanium, silicon oxide, silicon nitride, or the combination thereof.

In one embodiment of the present invention, the protrusion has a height not higher than the upper surface.

The disclosure of the present invention provides a method of fabricating a wafer-level chip package. The method includes providing a semiconductor wafer having at least two semiconductor chips arranged adjacently, the semiconductor chip has an upper surface and a lower surface, and the semiconductor chip has a plurality of conductive pads disposed on the upper surface. At least one recess and a plurality of protrusions are formed, the recess is located between the semiconductor chips, and the protrusions are disposed in the recess. A metal layer covering the upper surface, the recess and the protrusions is blanketly formed, and etched the metal layer with photolithography to form a plurality of first redistribution metal lines, the first redistribution metal lines are electrically connected to the conductive pads individually, and extended into the recess separately, so as to isolate the first redistribution metal lines by the protrusions in the recess.

In one embodiment of the present invention, the steps of forming the recess and the protrusions are formed by the photolithography at a same step.

BRIEF DESCRIPTION OF THE DRAWINGS

The present invention can be more fully understood by reading the following detailed description of the embodiments, with reference made to the accompanying drawings as follows.

DETAILED DESCRIPTION

Figure 1:
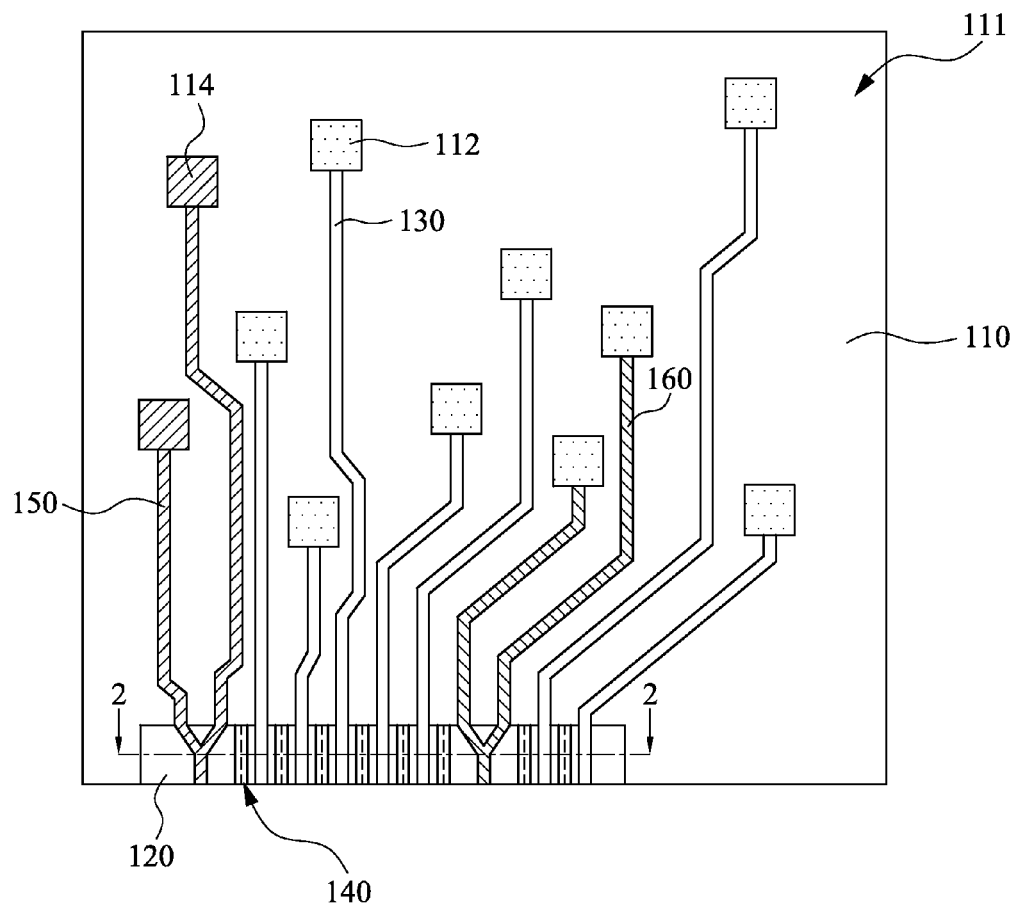
FIG. 1 is a part of the top view of a chip package 100 according to one embodiment of the present invention.

Reference will now be made in detail to the present embodiments of the invention, examples of which are illustrated in the accompanying drawings. Wherever possible, the same reference numbers are used in the drawings and the description to refer to the same or like parts. In the following detailed description, for purposes of explanation, numerous specific details are set forth in order to provide a thorough understanding of the disclosed embodiments. It will be apparent, however, that one or more embodiments may be practiced without these specific details.

FIG. 1 is a part of the top view of a chip package according to one embodiment of the present invention. Please refer to FIG. 1, a chip package 100 includes a semiconductor chip 110, at least one recess 120, a plurality of first redistribution metal lines 130, and at least one protrusion 140. The semiconductor chip 110 has a plurality of conductive pads 112 disposed on an upper surface 111 of the semiconductor chip. The semiconductor chip 110 may be produced on a semiconductor wafer substrate such as silicon, germanium, or other III-V group elements. The semiconductor chip 110, for example, may have electronic components (not shown) in semiconductor chip 110, and the electronic components are electrically connected to the conductive pads 112, which is disposed on an upper surface 111 of the semiconductor chip 110. A method of electrical connection, for example, is providing an inner connection structure (not shown) in the semiconductor chip 110 electrically connected to the electronic components. Accordingly, the conductive pad 112 can control the input/output signal of the electronic components in the chip package. The conductive pad 112 may be formed of aluminum, copper, nickel, or other suitable metal materials. The electronic components 114 of the present invention may include, but not limited to active elements, passive elements, electronic components of integrated circuits, such as digital circuits or analog circuits, micro electro mechanical systems (MEMS), micro fluidic systems, physical sensors of measuring physical quantity variation, such as heat, light and pressure, RF circuits, accelerators, gyroscopes, micro actuators, surface acoustic wave (SAW) device, pressure sensors.

Figure 2:
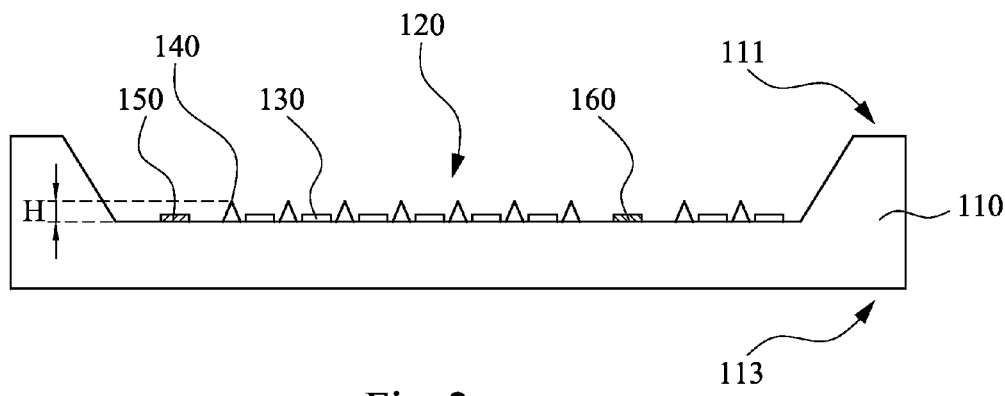
FIG. 2 is a cross-sectional view taken along line 2 shown in FIG. 1.

FIG. 2 is a cross-sectional view taken along line 2 shown in FIG. 1. Please refer to FIG. 2 with FIG. 1, the recess 120 is extended from an upper surface 111 to a lower surface 113 of the semiconductor chip 110, and arranged on a side of semiconductor chip 110. In other words, the recess 120 is placed on the edge of the semiconductor chip. As shown in FIG. 1, according to some embodiments of the present invention, the chip package 100 includes, but not limited to a recess 120 disposed on a side of the semiconductor chip 110. According to some embodiments of the present invention, the chip package 100 also includes two or more recesses 120 all disposed on the same side, or separately on different sides of the semiconductor chip 110. The recess 120 may be formed by photolithography from an upper surface 111 to a lower surface 113 of the semiconductor chip 110. In some embodiments, the recess 120 on the chip package 100 is a bonding place for a solder ball or line for external electrical connection.

Please continuously refer to FIG. 1 with FIG. 2, a plurality of first redistribution metal lines 130 are disposed on an upper surface 111, electrically connected to the conductive pads 112 individually, and extended into the recess 120 separately. As shown in FIG. 1, each first redistribution metal line 130 is electrically connected to each conductive pad 112. Therefore, each first redistribution metal line 130, which has an independent signal, individually controls the input/output signal of the conductive pad 112 in semiconductor chip 110. The first redistribution metal line 130 may be formed of aluminum, copper, or other suitable metal materials. To form the first redistribution metal lines, sputtering or evaporation is firstly used to deposit a conductive thin film. Then etch the conductive thin film with photolithography to produce the first redistribution metal lines 130, which has a fixed redistribution line pattern. Besides, the chip package 100 of the present invention may further includes an insulation layer (not shown) disposed between the upper surface 111 of semiconductor chip 110 and the first redistribution metal lines 130. The insulation layer may be formed of silicon oxide, silicon nitride, silicon oxynitride, or other suitable isolation materials. Use chemical vapor deposition to form an insulation thin film conformally along the upper surface 111 of semiconductor chip 110, and the sidewall and the bottom of recess 120. Then etch the position of conductive pad 112 with photolithography to form an opening to expose conductive pad 112, so that the first redistribution metal line 130 may electrically connect to conductive pad via the opening of insulation layer afterwards. Especially, as shown in FIG. 2, the protrusions 140 are disposed in the recess 120, and located between the adjacent first redistribution metal lines 130. The protrusions 140 can make sure that the adjacent redistribution metal lines 130 are isolated, and do not electrically connect with each other resulting in short circuit. To sum up, a method of fabricating a chip package includes providing a semiconductor wafer having at least two semiconductor chips 110 arranged adjacently, the semiconductor chip has an upper surface 111 and a lower surface 113, and the semiconductor chip 110 has a plurality of conductive pads 112 disposed on the upper surface 111, according to each embodiment of the present invention. At least one recess 120 and a plurality of protrusions 140 are formed, the recess 120 is located between the semiconductor chips 110, and the protrusions 140 are disposed in the recess 120. A metal layer covering the upper surface 111, the recess 120 and the protrusions 140 is blanketly formed, and etched the metal the metal layer with photolithography to form a plurality of first redistribution metal lines 130, the first redistribution metal lines 130 are electrically connected to the conductive pads 112 individually, and extended into the recess 120 separately, in order to isolate the first redistribution metal lines 130 separately by the protrusions 140 in the recess 120. It is known from the above statement, the first redistribution metal lines 130 are formed after fabricating the recess 120 and the protrusions 140, and the protrusions 140 in the recess 120 can make sure that the adjacent redistribution metal lines are isolated. According to above mentioned, not only the process margin in the photolithography can be increased during the fabrication of first redistribution metal lines, the yield rate of chip package can also be raised, in order to reduce the fabrication cost efficiently. The protrusion 140 includes silicon, germanium, silicon oxide, silicon nitride or the combination thereof. The fabrication method of the protrusions 140, for example, may be formed together with the recess 120 mentioned above via the same photolithography steps. In some embodiments of the present invention, the recess and protrusions are fabricated together through the same photolithography steps. As an example, semiconductor chip 110 may be made on silicon-based materials. As mentioned above, the recess 120 may be formed by photolithography from an upper surface 111 to a lower surface 113 of the semiconductor chip 110. The photo mask used in photolithography process is not only match with the pattern of the recess 120, but also with the pattern of the protrusions 140. Therefore, the recess 120 and the protrusions 140 are substantially optically exposed with the same photo mask and formed together after developing and etching process. In other words, the protrusions 140 substantially are completely fabricated with the recess 120, and do not need additional photolithography process. Therefore, the present invention has simple process and a special function of efficiently decreasing fabricating cost. Besides, as shown in FIG. 2, the protrusion 140 has a height H not higher than the upper surface 111 in some embodiments of the present invention. Accordingly, the protrusions 140 not only can make sure that the adjacent first redistribution metal lines 130 are isolated, and do not electrically connect with each other resulting in short circuit, but also do not block the fabrication of solder balls and lines afterwards.

Referring to FIG. 1, in some embodiments of the present invention, the chip package 100 further includes a plurality of second redistribution metal lines 150 disposed on the upper surface 111, the semiconductor chip 110 has a plurality of ground pads 114 disposed on the upper surface 111, and the second redistribution metal lines 150 are electrically connected to the ground pads 114 individually, and extended into the recess 120 separately. As shown in FIG. 1, the ground pads 114 are disposed on the upper surface 111, and, through interconnects, electronically connected to parts of the electronic components or a ground via in semiconductor chip 110 for grounding. The ground pad 114, for example, may be formed of the same materials during the same fabricating step with the conductive pad 112. Therefore, the ground pad 114, for example, may be formed of aluminum, copper, nickel, or other suitable metal materials. As shown in FIG. 1, the ground pad 114 can be used for electrical component detection in the semiconductor chip 110, or other circumstances require electrical grounding. The ground pad 114 is extending the conductive pathway of the electrical grounding into the recess 120 by electrical connection with the second redistribution metal lines 150. In addition, along with the electronic devices and portable electronic devices toward more popular and lighter, the chip package has a reduced size to answer the development trend of minimizing all kinds of integrating circuit process and multifunctional systemized chip. The coupling effect is increased when the density of interconnection and wiring between each device in semiconductor chip package is higher, resulting in frequently electromagnetic interference problem during signal transmission. Therefore, the ground pad 114 and second redistribution metal lines 150 may effectively solve the coupling effect by electrical grounding. As shown in FIGS. 1 and 2, the second redistribution metal lines 150 in the recess 120 may be electrically connected to each other in some embodiments of the present invention. In other words, the second redistribution metal lines 150 may be converged after extended into the recess 120, and not like the first redistribution metal lines 130, which are isolated by the protrusions 140. Accordingly, the above mentioned may simplify the connection for electrical grounding.

Besides, as shown in FIGS. 1 and 2, a chip package 100 in the embodiments of present invention further includes a plurality of third redistribution metal lines 160 deposed on the upper surface 111. The third redistribution metal lines 160 are individually extended into the recess 120 and electrically connected to each other in the recess 160. As shown in FIG. 1, each third redistribution metal line 160 is also connected to each conductive pad 112. The difference between the third redistribution metal lines 160 and the first redistribution metal lines 130 is that each first redistribution metal line 130 can be seen as an independent signal line and controlling input/output signal of different conductive pads 112 individually in semiconductor chip 110. Therefore, the protrusions 140 are disposed in the recess 120, and located between the adjacent first redistribution metal lines 130, in order to make sure that the adjacent redistribution metal lines 130 are isolated, and do not electrically connect with each other resulting in short circuit. The third redistribution metal lines 160 may be the lines of the conductive pads 112 with the same input/output signal. Thus, the protrusions 140 are not required to be placed in between the adjacent third redistribution metal lines 160. In other words, the third redistribution metal lines 160 may be converged in the recess 120 and then systemize the conductive pads 112 with the same signal to further simplify the input or output of the signal.

Figure 3:
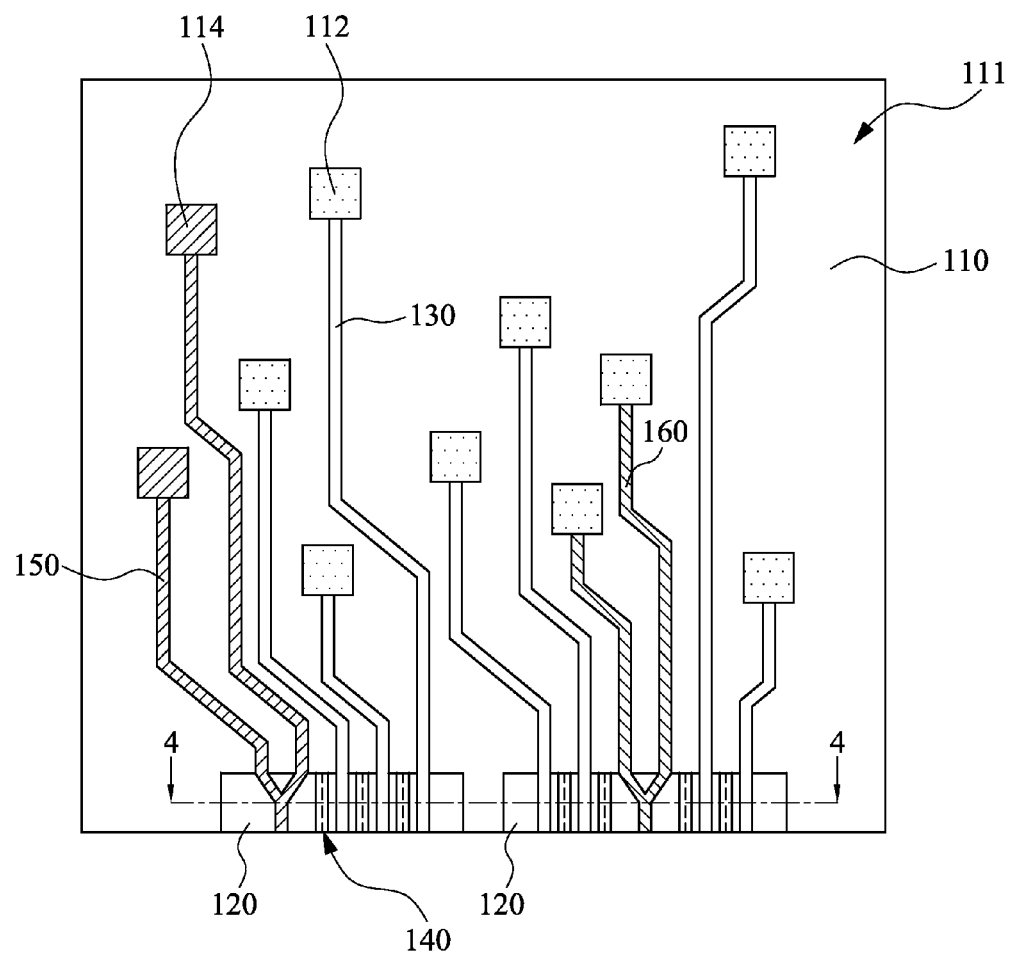
FIG. 3 is a part of the top view of a chip package according to another embodiment of the present invention.
Figure 4:
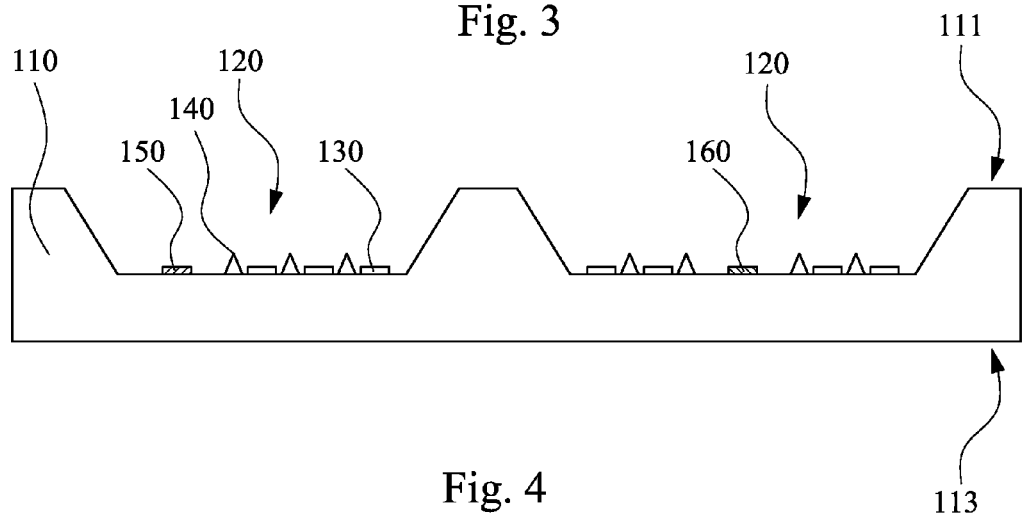
FIG. 4 is a cross-sectional view taken along line 4 shown in FIG. 3.

FIG. 3 is a part of the top view of a chip package 200 according to another embodiment of the present invention. FIG. 4 is a cross-sectional view taken along line 4 shown in FIG. 3. Please refer to FIG. 3 with FIG. 4, a chip package 200 includes a semiconductor chip 110, recesses 120, a plurality of first redistribution metal lines 130, protrusions 140. The embodiments are basically same as the above embodiments of the chip package 100 for the fabricating method and materials of the semiconductor chip 110, recesses 120, first redistribution metal lines 130, protrusions 140, and the relative position and connection of each component. The difference between the chip package 200 and chip package 100 mentioned in the embodiments above is that the chip package 200 has two recesses 120 disposed on the same side of the semiconductor chip 110. As shown in FIG. 3, a part of the first redistribution metal lines 130 are extended into the recess 120 on the left side, and the others are extended into the recess 120 on the right side. Accordingly, the first redistribution metal lines 130 pattern may not only be adjusted to match the position of different conductive pads 112 on the upper surface 111 of semiconductor chip 110, but also lower the difficulties on design and fabrication of the first redistribution metal lines 130. As shown in FIG. 4, the protrusions 140 are disposed in the recess 120, and located between the adjacent first redistribution metal lines 130. The protrusions 140 can make sure that the adjacent redistribution metal lines 130 are isolated, and do not electrically connect with each other resulting in short circuit. Accordingly, based on above statement, not only the process margin in the photolithography can be increased during the fabrication of first redistribution metal lines 130, the yield rate of chip package 200 can also be raised, in order to reduce the fabrication cost efficiently. Besides, the recess 120 may be formed by photolithography from an upper surface 111 to a lower surface 113 of the semiconductor chip 110. The photo mask used in photolithography process is not only match with the pattern of the recess 120, but also with the pattern of the protrusions 140. Therefore, the recess 120 and the protrusions 140 are substantially optically exposed with the same photo mask and formed together after developing and etching process. In other words, the protrusions 140 substantially are completely fabricated with the recess 120, and do not need additional photolithography process. Therefore, the present invention has simple process and a special function of efficiently decreasing fabricating cost.

Figure 5:
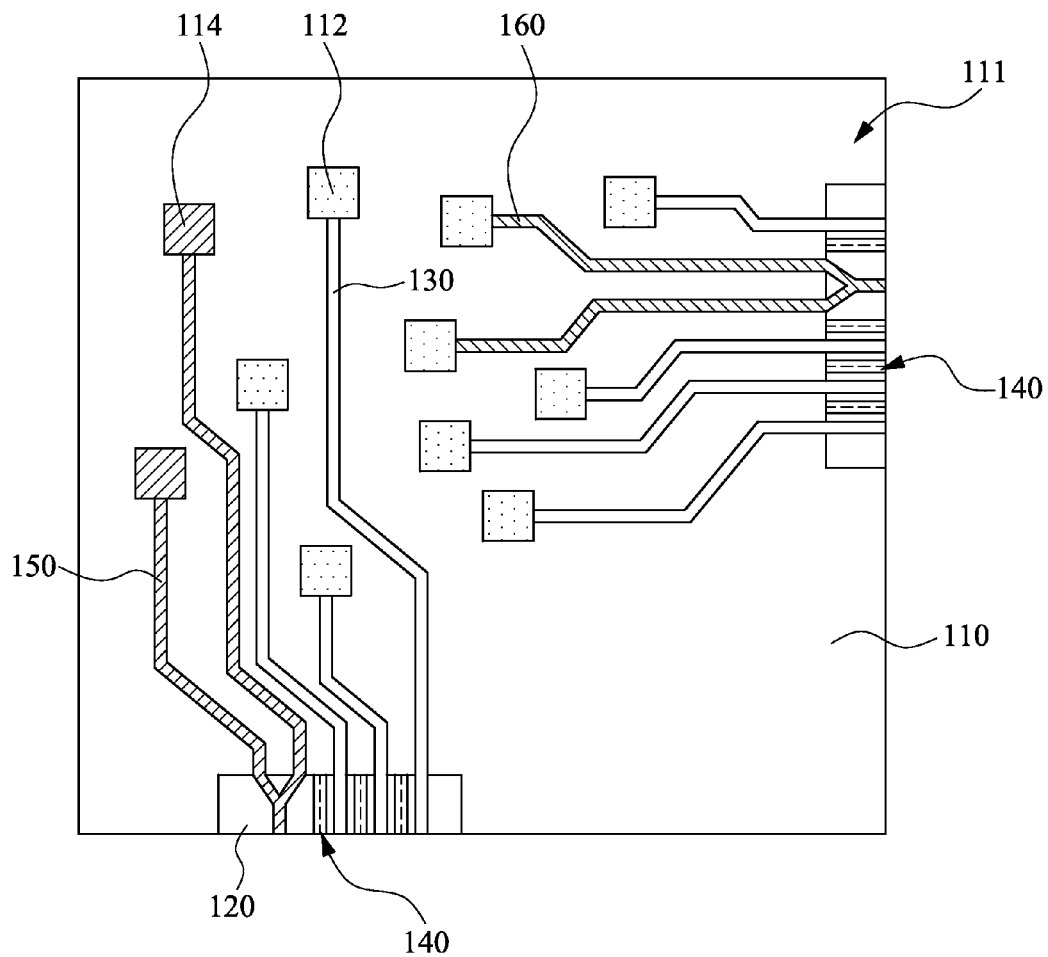
FIG. 5 is a part of the top view of a chip package according to another embodiment of the present invention.

FIG. 5 is a part of the top view of a chip package 300 according to another embodiment of the present invention. Please refer to FIG. 5. The chip package 300 includes a semiconductor chip 110, recesses 120, a plurality of first redistribution metal lines 130, and protrusions 140. The fabricating method, materials of semiconductor chip 110, recesses 120, first redistribution metal lines 130, protrusions 140 and the relative position and connection of each component may be almost the same as the chip package 100 mentioned in the embodiments above. The difference between chip package 300 and chip package 100 mentioned in the embodiments above is that the chip package 300 has two recesses 120 disposed on different sides of semiconductor chip 110. As shown in FIG. 5, a part of first redistribution metal lines 130 are extended into the recess 120 on the bottom side. The other part of first redistribution metal lines 130 are extended into the recess 120 on the right side. Similar to the chip package 200 mentioned in the embodiments above, the first redistribution metal lines 130 pattern may not only be adjusted to match the position of different conductive pads 112 on the upper surface 111 of semiconductor chip 110, but also lower the difficulties on design and fabrication of the first redistribution metal lines 130. In addition, the protrusions 140 are disposed in the recess 120 and between the adjacent first redistribution metal lines 130. The protrusions 140 can make sure that the adjacent first redistribution metal lines 130 are isolated, and do not electrically connect with each other resulting in short circuit. Accordingly, based on above statement, not only the process margin in the photolithography can be increased during the fabrication of first redistribution metal lines 130, the yield rate of chip package 200 can also be raised, in order to reduce the fabrication cost efficiently. Besides, the recess 120 may be formed by photolithography from an upper surface 111 to a lower surface 113 of the semiconductor chip 110. The photo mask used in photolithography process is not only match with pattern of the recess 120, but also with the pattern of the protrusions 140. Therefore, the recess 120 and the protrusions 140 are substantially optically exposed with the same photo mask and formed together after the developing and etching process. In other words, the protrusions 140 substantially are completely fabricated with the recess 120, and do not need additional photolithography process. Therefore, the present invention has simple process and a special function of efficiently decreasing fabricating cost.

Figure 6:
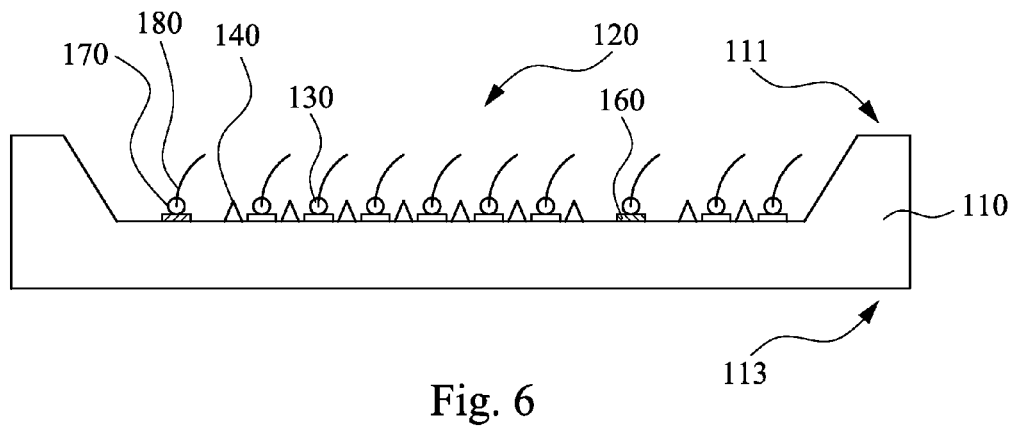
FIG. 6 is a part of the cross-sectional view of recess in a chip package according to some embodiments of the present invention.

FIG. 6 is a part of the cross-sectional view of the recess 120 in a chip package according to some embodiments of the present invention. In some embodiments in the present invention, the chip package further includes a plurality of solder balls 170 disposed on the recess 120 and individually located on the first redistribution metal lines 130. Therefore, the solder balls 170 are electrically connected to first redistribution metal lines 130. The solder ball 170 materials may be, for example, tin or other suitable metal or alloy. In some embodiments of the present invention, solder balls 170 may include tin. Solder balls 170 is the connection bridge between chip package and external printed circuit board (PCB) or other interposer. Accordingly, the input/output current from PCB or other interposer may control input/output signal of electrical component in chip package via solder balls 170, first redistribution metal lines 130 and conductive pads 112. However, present invention is not limited to above statement. The chip package may further include solder balls 170 and solder lines 180, which are connected to solder balls 170, in another embodiment of the present invention. In this way, solder balls 170 and solder lines 180 may be the connection bridge between chip package and external PCB or other interposer. Accordingly, the input/output current from PCB or other interposer may control input/output signal of electrical component on the chip package via solder balls 170, solder lines 180, first redistribution metal lines 130 and conductive pad 112. Besides, the chip package of the present invention may also include a encapsulate layer covering the upper surface 111 of semiconductor chip 110, first redistribution metal lines 130, recess 120 and protrusions 140. Encapsulate layer 150 may be formed of solder mask or other suitable packaging materials. The encapsulate layer is formed by coating along the upper surface 111 of semiconductor ship 110, first redistribution metal lines 130, recess 120 and protrusions 140.

Lastly, emphasize that the present invention is providing a chip package. The recess of the chip package has protrusions located between adjacent redistribution metal lines, which need independent signal. Based on the above statement, the protrusions can make sure that the adjacent first redistribution metal lines are isolated, and do not electrically connect with each other resulting in short circuit. Accordingly, based on above statement, not only the process margin in the photolithography can be increased during the fabrication of first redistribution process lines, the yield rate of chip package can also be raised, in order to reduce the fabrication cost efficiently. Besides, the protrusions substantially are completely fabricated with the recess, and do not need additional photolithography process. Therefore, the present invention has the less complicated process and the efficacy of efficiently decreasing fabricating cost.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A chip package, comprising:
   a semiconductor chip having a plurality of conductive pads disposed on an upper surface of the semiconductor chip;
   at least one recess recessed from the upper surface of the semiconductor chip, and located on a side of the upper surface of the semiconductor chip;
   a plurality of first redistribution metal lines disposed on the upper surface, electrically connected to the conductive pads individually, and extended into the recess separately; and
   at least one protrusion disposed in the recess and located between adjacent first redistribution metal lines.

2. The chip package of claim 1, further comprising a plurality of second redistribution metal lines disposed on the upper surface, the semiconductor chip having a plurality of ground pads disposed on the upper surface, and the second redistribution metal lines electrically connected to the ground pads individually, and extended into the recess separately.

3. The chip package of claim 2, wherein the second redistribution metal lines are electrically connected to each other in the recess.

4. The chip package of claim 1, further comprising a plurality of third redistribution metal lines disposed on the upper surface, extended into the recess separately, and electrically connected to each other in the recess.

5. The chip package of claim 1, further comprising a conductive structure disposed in the recess, and located on the first redistribution metal lines individually.

6. The chip package of claim 5, wherein the conductive structure comprises a plurality of solder balls.

7. The chip package of claim 6, wherein the solder balls comprise tin.

8. The chip package of claim 1, wherein the protrusion comprises silicon, germanium, silicon oxide, silicon nitride, or the combination thereof.

9. The chip package of claim 1, wherein the protrusion has a height not higher than the upper surface.

10. A method of fabricating a chip package, comprising:
    providing a semiconductor wafer having at least two semiconductor chips arranged adjacently, each semiconductor chip having an upper surface and a lower surface, and each semiconductor chip having a plurality of conductive pads disposed on the upper surface;

forming at least one recess and a plurality of protrusions, the recess located between the at least two adjacent semiconductor chips, and the protrusions disposed in the recess, wherein the recess is recessed from the upper surface of each adjacent semiconductor chip, and located on a side of the upper surface of each adjacent semiconductor chip;

forming a metal layer blanketly covering the upper surface of each adjacent semiconductor chip, the recess and the protrusions; and etching the metal layer covering the upper surface of each adjacent semiconductor chip with photolithography to form a plurality of first redistribution metal lines disposed on the upper surface, the first redistribution metal lines electrically connected to the conductive pads individually, and extended into the recess separately, wherein the protrusions are located between adjacent first redistribution metal lines so as to isolate the first redistribution metal lines by the protrusions in the recess.

11. The method of fabricating a chip package of claim 10, wherein the steps of forming the recess and the protrusions are formed by the photolithography at a same step.

* * * * *